US012469664B2

(12) United States Patent
Fukuta et al.

(10) Patent No.: US 12,469,664 B2
(45) Date of Patent: Nov. 11, 2025

(54) CHARGED PARTICLE GUN AND CHARGED PARTICLE BEAM SYSTEM

(71) Applicant: Hitachi High-Tech Corporation, Tokyo (JP)

(72) Inventors: Masahiro Fukuta, Tokyo (JP); Keigo Kasuya, Tokyo (JP); Noriaki Arai, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 553 days.

(21) Appl. No.: 17/917,305

(22) PCT Filed: Apr. 23, 2020

(86) PCT No.: PCT/JP2020/017560

§ 371 (c)(1),
(2) Date: Oct. 6, 2022

(87) PCT Pub. No.: WO2021/214953

PCT Pub. Date: Oct. 28, 2021

(65) Prior Publication Data

US 2023/0178325 A1 Jun. 8, 2023

(51) Int. Cl.
*H01J 37/07* (2006.01)
*H01J 37/28* (2006.01)

(52) U.S. Cl.
CPC .............. *H01J 37/07* (2013.01); *H01J 37/28* (2013.01); *H01J 2237/061* (2013.01); *H01J 2237/06375* (2013.01)

(58) Field of Classification Search
CPC .. H01J 37/00; H01J 37/02; H01J 37/26; H01J 37/28; H01J 37/065; H01J 2237/061;
(Continued)

(56) References Cited

U.S. PATENT DOCUMENTS 3,808,498 A * 4/1974 Fujisawa ................. H01J 3/026 313/355
2001/0040215 A1* 11/2001 Ahmed ................. H01J 37/073 250/311
(Continued)

FOREIGN PATENT DOCUMENTS

EP 2 301 056 B1 1/2018
JP 2-98029 A 4/1990
(Continued)

OTHER PUBLICATIONS

International Search Report (PCT/ISA/210) issued in PCT Application No. PCT/JP2020/017560 dated Jul. 21, 2020 with English translation (five (5) pages).
(Continued)

*Primary Examiner* — Jason L Mccormack
(74) *Attorney, Agent, or Firm* — Crowell & Moring LLP

(57) ABSTRACT

An electron gun 901 capable of suppressing an uneven temperature distribution at an extraction electrode and a length-measuring SEM 900 are provided. The electron gun 901 is equipped with: a charged particle source 1; an extraction electrode 3 for extracting charged particles from the charged particle source 1 and allowing some of the charged particles to pass while blocking some other charged particles; and an auxiliary structure 5 disposed in contact with the extraction electrode 3. The length-measuring SEM 900 is equipped with the electron gun 901 and a computer system 920 for controlling the electron gun 901.

14 Claims, 9 Drawing Sheets

(58) Field of Classification Search
CPC ..... H01J 2237/06375; H01J 2237/0653; H01J 2237/2817; H01J 2237/002; H01J 1/46; H01J 3/02; H01J 3/026
USPC .............................. 250/306, 307, 311, 492.3
See application file for complete search history.

(56) References Cited

U.S. PATENT DOCUMENTS

| | | | | |
|---|---|---|---|---|
| 2006/0033037 | A1* | 2/2006 | Kawasaki | H01J 37/153 250/492.23 |
| 2017/0076902 | A1 | 3/2017 | Shichi et al. | |
| 2017/0178857 | A1 | 6/2017 | Holden et al. | |
| 2020/0090897 | A1* | 3/2020 | Kasuya | H01J 37/075 |
| 2020/0365360 | A1* | 11/2020 | Matsubara | H01J 37/28 |
| 2021/0040215 | A1* | 2/2021 | Levade | G01N 33/56972 |
| 2022/0037107 | A1 | 2/2022 | Matsunaga et al. | |

FOREIGN PATENT DOCUMENTS

| | | | |
|---|---|---|---|
| JP | 9-17365 | A | 1/1997 |
| JP | 2000-294182 | A | 10/2000 |
| JP | 2002-216686 | A | 8/2002 |
| JP | 2003-100244 | A | 4/2003 |
| JP | 2012-33297 | A | 2/2012 |
| JP | 2020-47407 | A | 3/2020 |
| TW | 201732860 | A | 9/2017 |
| TW | 202013421 | A | 4/2020 |
| WO | WO 2015/019665 | A1 | 2/2015 |

OTHER PUBLICATIONS

Japanese-language Written Opinion (PCT/ISA/237) issued in PCT Application No. PCT/JP2020/017560 dated Jul. 21, 2020 (three (3) pages).

Japanese-language International Preliminary Report on Patentability (PCT/IPEA/409) issued in PCT Application No. PCT/JP2020/017560 dated Nov. 19, 2020, including Annexes with partial English Translation (17 pages).

Taiwanese-language Office Action issued in Taiwanese Application No. 110108075 dated Jan. 6, 2022 (seven (7) pages).

* cited by examiner

[FIG. 1]
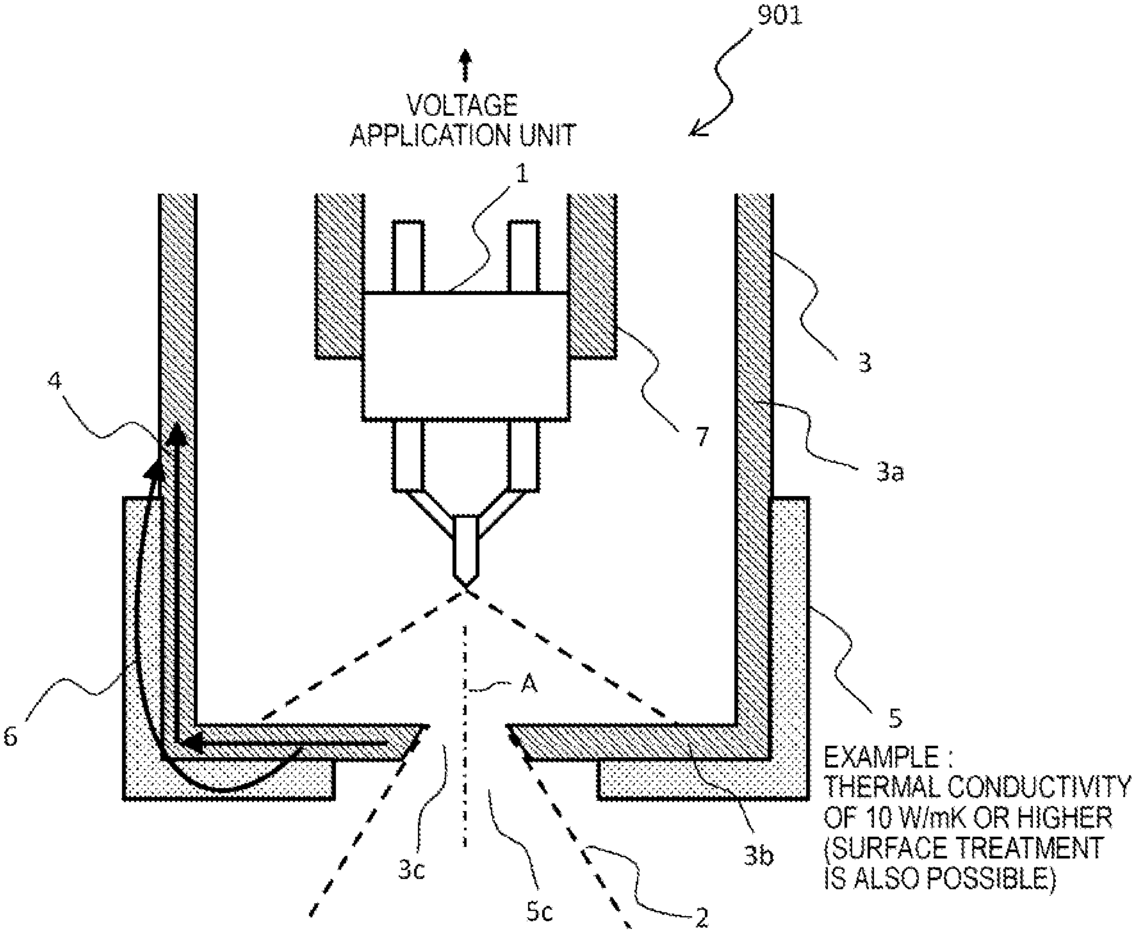

WITHOUT AUXILIARY STRUCTURE

WITH AUXILIARY STRUCTURE

[FIG. 4]
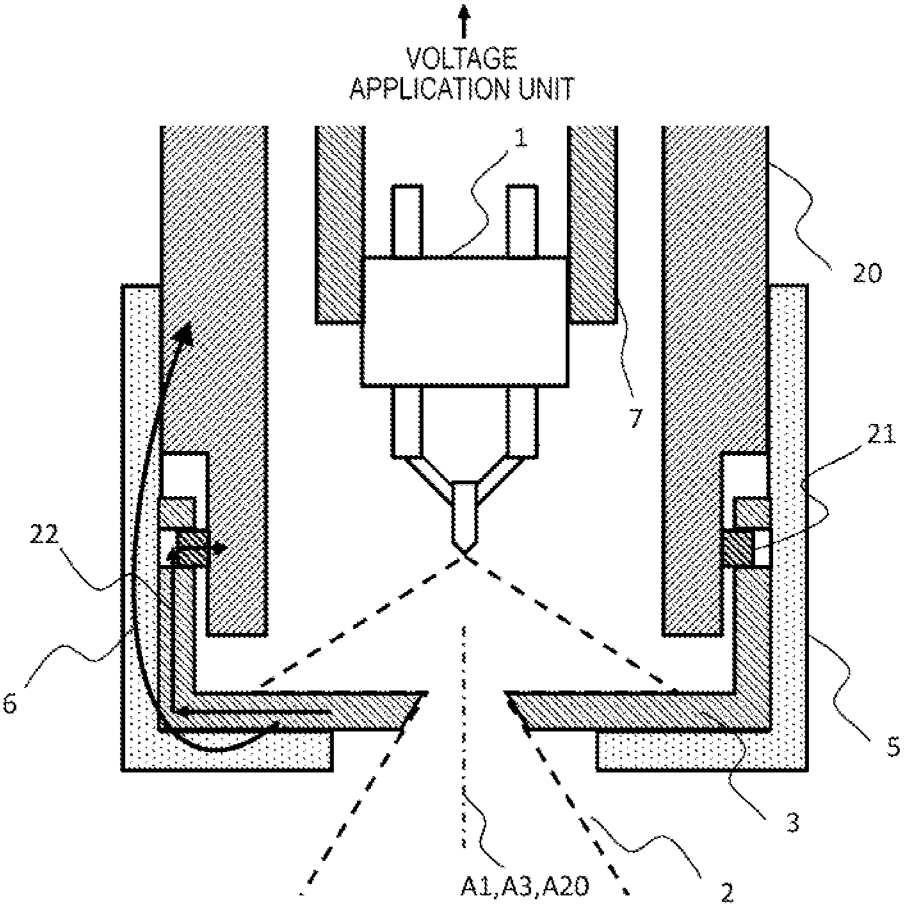

[FIG. 6]
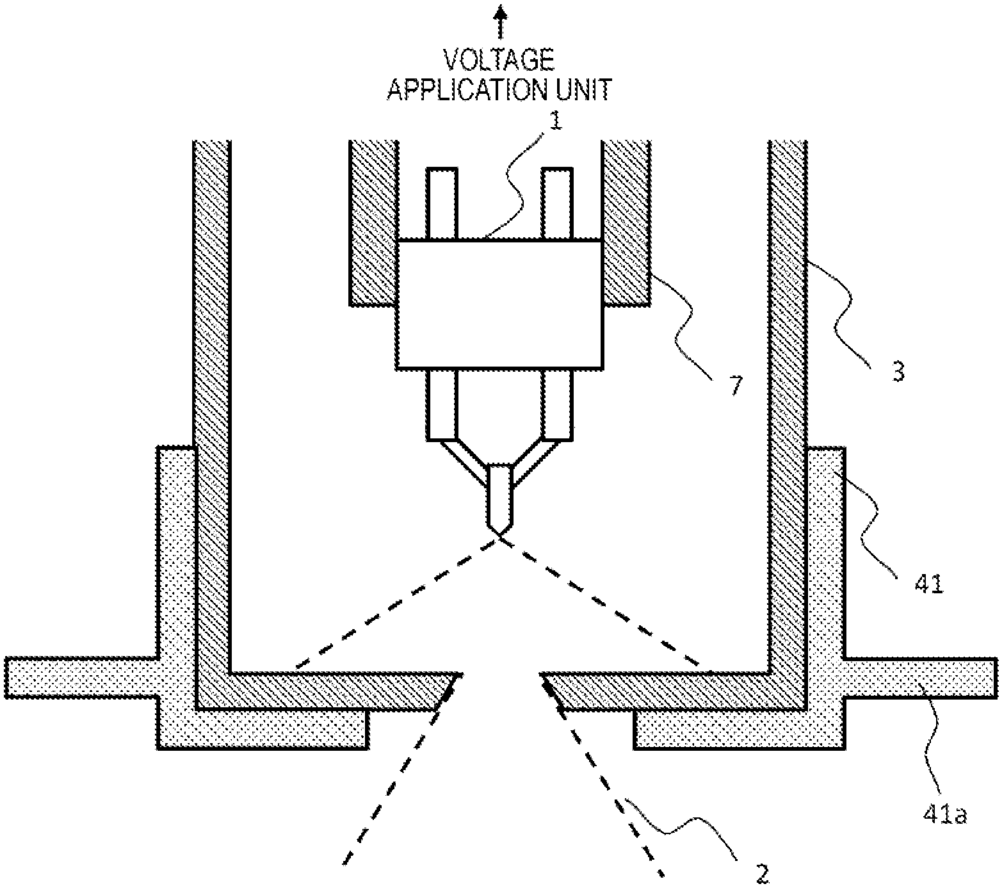

FIG. 7A
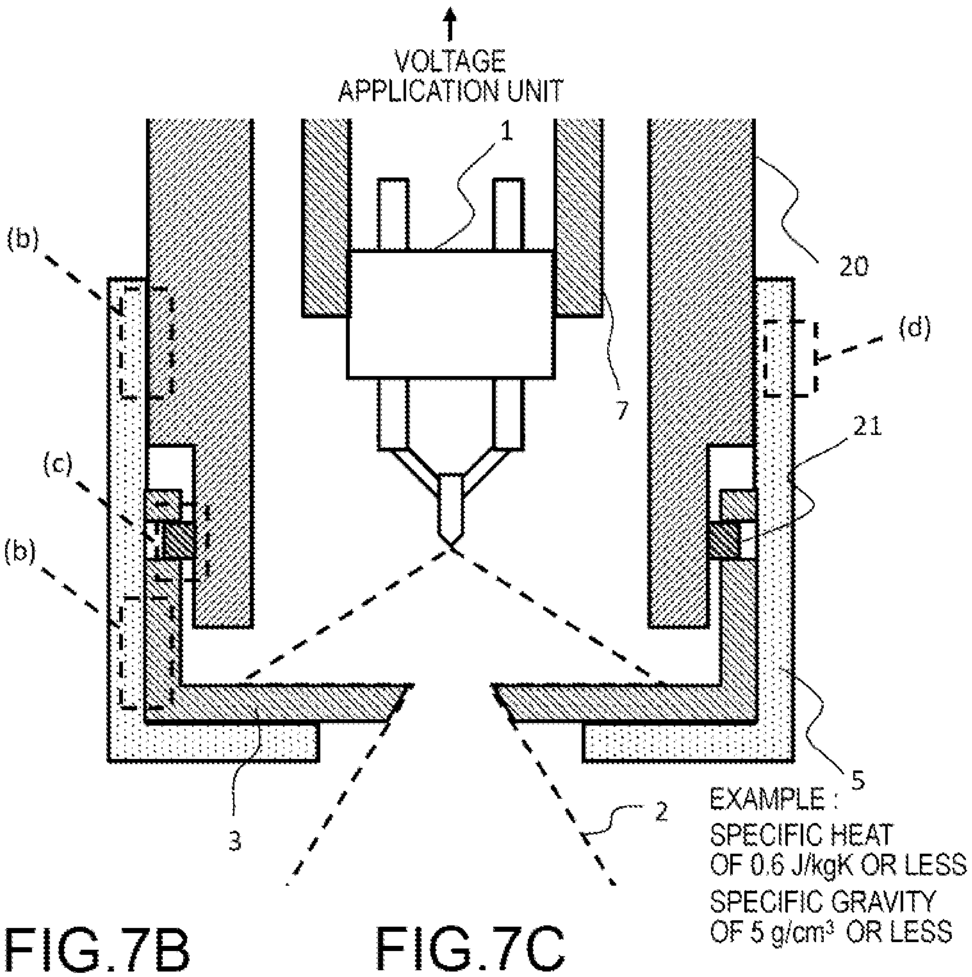
FIG.7B
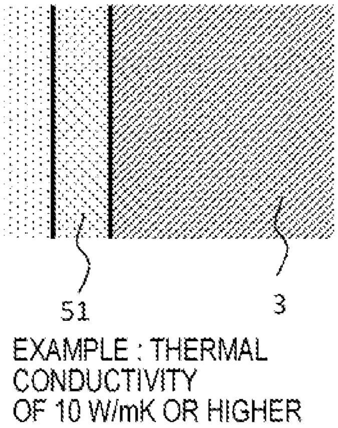
FIG.7C
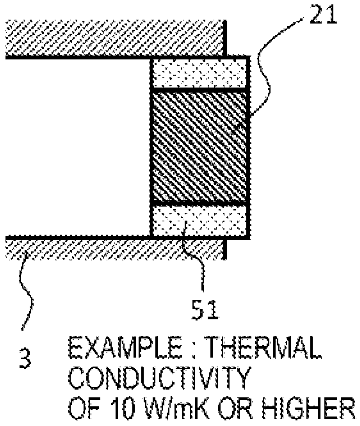
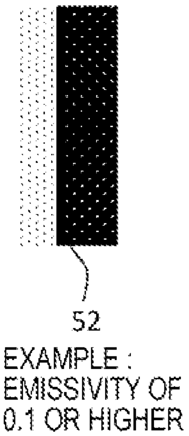
FIG. 7D

[FIG. 8]
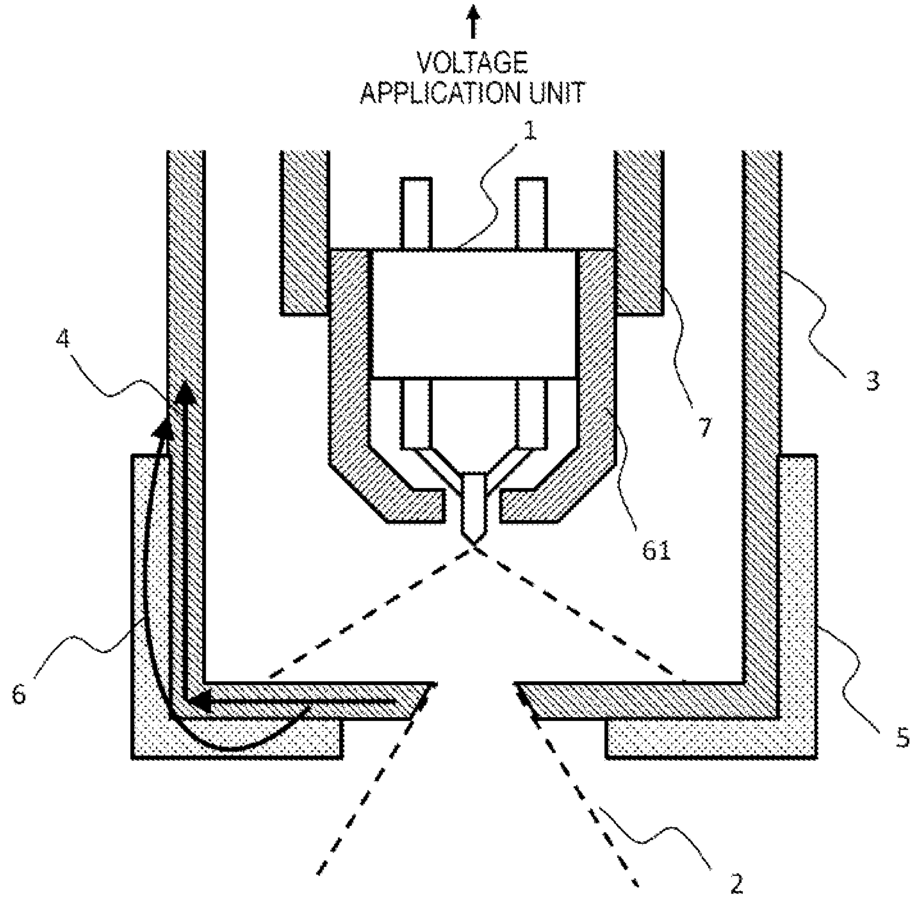

[FIG. 9]
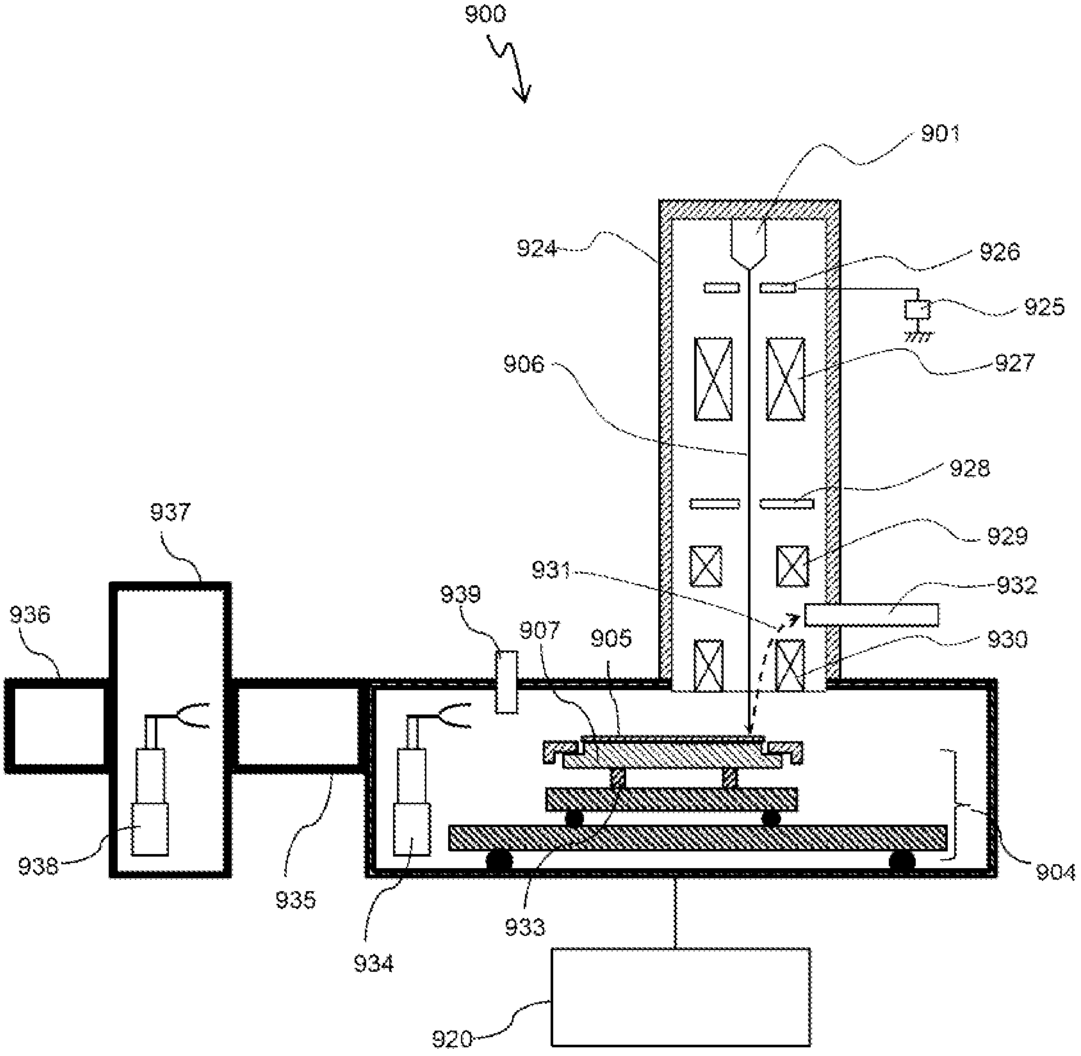

CHARGED PARTICLE GUN AND CHARGED PARTICLE BEAM SYSTEM

TECHNICAL FIELD

The present invention relates to a charged particle gun and a charged particle beam system.

BACKGROUND ART

Currently, the wafer observation area is increasing in the semiconductor inspection device market. In particular, in EUV lithography using extreme ultraviolet light, observation of the entire surface of the wafer is essential, and thus it takes several days to several tens of days to inspect defects and dimensions with the current device throughput. Therefore, in semiconductor inspection devices, in addition to the throughput improvement of the inspection device, the ability to operate stably for a long period of time, that is, the ability to perform inspection and measurement with high accuracy continuously for a long period of time is an important index that determines the value of the device.

Here, stable charged particle emission is an element that supports long-term stable operation of the device. When the charged particle emission shows an unstable behavior, the observation results will change and the inspection results will become unstable. Therefore, in order to perform high-accuracy inspection continuously for a long period of time, it is necessary to keep the quality of sample observation results constant. In order to achieve this, a charged particle gun that can stably provide charged particle emission for a long period of time is required.

As an example of such technology for improving the stability of charged particle emission, there is a technology described in JP-A-2002-216686 (PTL 1). In PTL 1, the operation stability of the charged particle gun is improved by making the central axis of the extraction electrode and the suppressor match the central axis of the needle electrode. An electric field is applied to the needle electrodes in a rotationally symmetrical manner about the central axis to achieve stable charged particle emission.

CITATION LIST

Patent Literature

PTL 1: JP-A-2002-216686

SUMMARY OF INVENTION

Technical Problem

However, the conventional technology has a problem that an uneven temperature distribution occurs in the extraction electrode.

In order to improve the throughput of the device, it is effective to increase the amount of charged particles emitted from the charged particle source and observe the sample at high speed. However, when the amount of charged particles emitted from the charged particle source is increased, heat generation and thermal expansion occur in the extraction electrode, which may hinder stable operation of the charged particle gun.

Since 99% or more of the charged particles emitted from the charged particle source collide with the extraction electrode, a current due to the inflow and outflow of electrons is generated in the extraction electrode. Since a voltage of several kV is constantly applied to the extraction electrode to extract the charged particles from the charged particle source, electric power is generated by the applied voltage and the current generated by the charged particles, and heat is generated in the extraction electrode.

Here, electric power W generated by charged particle irradiation can be obtained by $$W=V\times I \quad \text{Expression (1)}$$

when the applied voltage is V and the current generated by the charged particles is I.

For example, when a current of 500 μA to the extraction electrode to which a voltage of 3 kV is applied is generated, the electric power generated in the extraction electrode is 1.5 W, and the temperature rise due to heat generation exceeds 100° C.

The main shape of the extraction electrode is a cup-like structure as shown in PTL 1, and charged particles collide with a surface disposed perpendicular to the optical axis to generate heat. The thermal conductance of the extraction electrode is small, and the inside of the charged particle gun is in a vacuum state, and thus an adiabatic state is achieved and the heat radiation amount is small. Therefore, the heat generated in the extraction electrode cannot escape, and the heat is accumulated in the part irradiated with charged particles (charged particle irradiation portion), and the temperature of only the charged particle irradiation portion rises. Therefore, under the operating conditions of the charged particle gun in high-throughput observation, a temperature gradient is generated in which the temperature of the charged particle irradiation portion rises and the temperature decreases with increasing distance from the charged particle irradiation portion. This results in an uneven temperature distribution within the extraction electrode.

In PTL 1, the extraction electrode is connected to the extraction electrode base with a screw. In such a structure, heat conduction around the screw is small, and thus a temperature difference occurs between the extraction electrode and the extraction electrode base. Therefore, even in the structure shown in PTL 1, local thermal expansion occurs due to uneven temperature distribution.

PTL 1 describes that the central axis of the extraction electrode and the central axis of the needle electrode continue to match each other, but when trying to achieve high throughput and increasing the amount of charged particles emitted, uneven thermal expansion within the extraction electrode makes it difficult for each central axis to continue to match each other. As a result, it becomes difficult to stably operate the charged particle gun, resulting in loss of machine time and frequent maintenance work to align the central axis of the charged particle source with the central axis of the extraction electrode.

The present disclosure has been made to solve such problems, and an object thereof is to provide a charged particle gun and a charged particle beam system capable of suppressing uneven temperature distribution in the extraction electrode.

Solution to Problem

An example of a charged particle gun according to the present disclosure includes: a charged particle source; an extraction electrode that extracts charged particles from the charged particle source, allows some of the charged particles to pass therethrough, and blocks some other charged particles; and a heat transfer structure that is in contact with the extraction electrode.

In addition, an example of a charged particle beam system according to the present disclosure includes: the charged particle gun described above; and a computer system that controls the charged particle gun.

Advantageous Effects of Invention

A charged particle gun and a charged particle beam system according to the present disclosure equalize the temperature of the extraction electrode by increasing heat conduction in the charged particle irradiation portion of the extraction electrode. As a result, the thermal expansion of the extraction electrode is suppressed or made uniform, and thus the amount of charged particles emitted from the charged particle source is kept constant or fluctuates less. As a result, even when the amount of charged particles is large, the charged particle gun and charged particle beam system operate stably for a long period of time, and thus productivity and maintainability are improved.

In this manner, it becomes possible to increase the amount of charged particles emitted from the charged particle gun, thereby improving the throughput of the charged particle gun and the charged particle beam system while enabling high-accuracy operation (for example, high-accuracy inspection and measurement) over a long period of time.

BRIEF DESCRIPTION OF DRAWINGS

FIG. 1 is a configuration example of an electron gun according to Examples 1, 4, and 9.

FIG. 4 is a configuration example of an electron gun according to Example 2.

FIG. 6 is a configuration example of an electron gun according to Example 5.

FIGS. 7A to 7D are a configuration example of an electron gun according to Examples 6 to 8.

FIG. 8 is a configuration example of an electron gun according to Example 10.

FIG. 9 is a configuration example of a charged particle beam system according to Example 1.

DESCRIPTION OF EMBODIMENTS

Figure 2A:
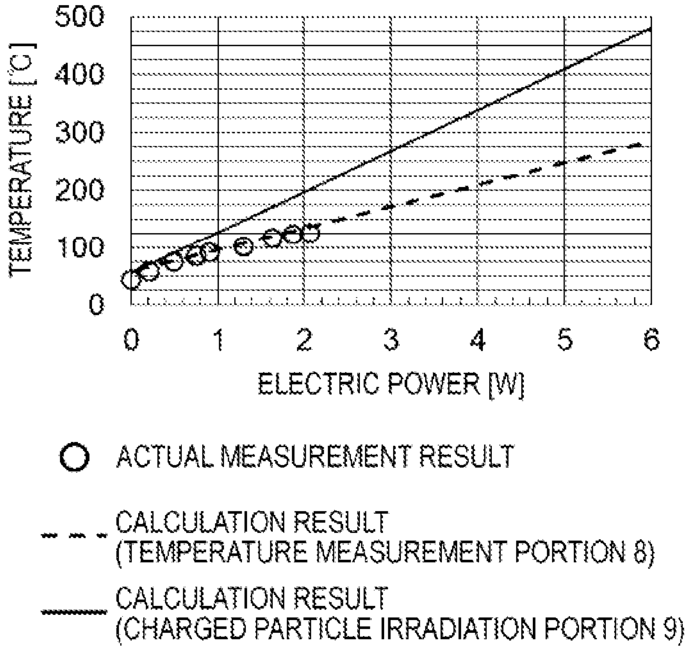
FIGS. 2A and 2B are a comparative example which is an example of a heat generation situation in a charged particle gun having a conventional configuration.

Examples of the present disclosure will be described below with reference to the drawings. In the attached drawing, there is also a case where elements that are functionally the same are displayed with the same number or corresponding number. In addition, in the drawings used in the following examples, hatching may be added even in plan views to make the drawings easier to see. The attached drawings illustrate examples in accordance with the principles of the present disclosure, but these are for the purpose of understanding the present disclosure and are by no means used in a limited interpretation of the present disclosure. The description in the present specification is merely a typical example and does not in any sense limit the scope of the claims or application examples of the present disclosure.

In the following examples, although the description thereof has been made in sufficient detail for those skilled in the art to implement the present disclosure, it is necessary to understand that other implementations or aspects are possible, and that changes in configuration or structure or substitution of various elements are possible without departing from the scope and spirit of the technical ideas of the present disclosure. Therefore, the following statements should not be interpreted while being limited thereto.

In addition, in the description of the embodiments below, an example is illustrated in which a charged particle gun (electron gun unit) of the present disclosure is applied to a charged particle beam system (pattern measurement system) composed of a scanning electron microscope (SEM) using an electron beam and a computer system. However, this example should not be construed as limiting, and the present disclosure may be applied to, for example, a wafer defect inspection system, a device using a charged particle beam such as an ion beam, a general observation device, and the like.

Example 1

As an example of the charged particle beam system according to the present disclosure, a length-measuring SEM (also referred to as a critical-dimension scanning electron microscope (CD-SEM)) used for measuring the dimensions of gates or contact holes in semiconductor devices is taken as an example, and the configuration and principle of a length-measuring SEM 900 according to the present disclosure will be described with reference to FIG. 9.

FIG. 9 shows a configuration example of a charged particle beam system according to Example 1. In this example, the charged particle beam system is configured as the length-measuring SEM 900. The length-measuring SEM 900 includes an electron gun 901 (charged particle gun). Although electrons are used as an example of charged particles in this example, a charged particle gun that emits other charged particles can also be applied.

Electrons are emitted as charged particles from the electron gun 901 held in a housing 924 maintained in a high vacuum. Emitted electrons are accelerated by a primary electron acceleration electrode 926 to which a high voltage is applied by a high voltage power supply 925. The electron beam 906 (charged particle beam) is converged by an electron lens 927 for convergence. The amount of beam current of the electron beam 906 is then adjusted by an aperture 928. After that, the electron beam 906 is deflected by a scanning coil 929 to two-dimensionally scan a wafer 905 (semiconductor wafer) as a sample.

An electronic objective lens 930 is disposed directly above the wafer 905. The electron beam 906 is narrowed and focused by the electronic objective lens 930 and enters the wafer 905. Secondary electrons 931 generated as a result of incident primary electrons (electron beam 906) are detected by a secondary electron detector 932. Since the amount of detected secondary electrons reflects the shape of the sample surface, the surface shape can be imaged based on the information on the secondary electrons.

The wafer 905 is held on an electrostatic chuck 907 while ensuring a constant degree of flatness, and is fixed onto an X-Y stage 904. Note that FIG. 9 illustrates a sectional view of the housing and the internal structure thereof when viewed from the lateral direction. The wafer 905 is freely movable in both the X and Y directions, and can measure any position within the wafer plane. The X-Y stage 904 also includes a wafer transfer lift mechanism 933. The wafer transfer lift mechanism 933 incorporates an elastic body that can move up and down. Using this elastic body, the wafer

905 can be attached to and detached from the electrostatic chuck 907. The cooperative operation of the wafer transfer lift mechanism 933 and a transfer robot 934 enables transfer of the wafer 905 to and from a load chamber 935 (preliminary exhaust chamber).

The operation when transferring the wafer 905 to be measured to the electrostatic chuck 907 will be described below. First, the wafer 905 set in a wafer cassette 936 is carried into the load chamber 935 by a transfer robot 938 of a mini-environment 937. The inside of the load chamber 935 can be evacuated and released to the atmosphere by an evacuation system (not shown). The wafer 905 is transferred onto the electrostatic chuck 907 while maintaining the degree of vacuum in the housing 924 at a practically acceptable level by opening and closing a valve (not shown) and operating the transfer robot 934.

A surface potential meter 939 is attached to the housing 924. The surface potential meter 939 is fixed such that the position in the height direction is adjusted such that the distance from the probe tip end to the electrostatic chuck 907 or the wafer 905 is appropriate, and the surface potential of the electrostatic chuck 907 or the wafer 905 can be measured without contact.

The length-measuring SEM 900 may include a computer system 920 that controls the electron gun 901. Each component of the length-measuring SEM 900 described above can be realized using a general-purpose computer. Each component may be realized as a function of a program executed on a computer. In the example of FIG. 9, the computer system 920 realizes the configuration of the control system. The computer system 920 includes at least a processor such as a central processing unit (CPU), a storage unit such as a memory, and a storage device such as a hard disk (including an image storage unit).

Furthermore, for example, the computer system 920 may be configured as a multi-processor system. Then, control of each component of the electron optical system in the housing 924 may be realized by the main processor. Also, the control of the X-Y stage 904, the transfer robot 934, the transfer robot 938, and the surface potential meter 939 may be realized by a sub-processor. Further, image processing for generating an SEM image based on the signal detected by the secondary electron detector 932 may be realized by the sub-processor.

The computer system 920 also has an input device for the user to input instructions, and the like, and a display device for displaying GUI screens and SEM images for inputting these instructions. The input device is a device that allows a user to input data or instructions, such as a mouse, a keyboard, a voice input device, and the like. The display device is, for example, a display unit. Such an input/output device (user interface) may be a touch panel capable of inputting and displaying data.

FIG. 1 shows a configuration example of the electron gun 901 in FIG. 9. The electron gun 901 has an extraction electrode 3. The extraction electrode 3 includes a cylindrical first part 3*a* and a conical or planar second part 3*b* (flat in this example). The electron gun 901 also includes an auxiliary structure 5. The extraction electrode 3 and the auxiliary structure 5 are disposed around a central axis A to be rotationally symmetrical or substantially rotationally symmetrical.

The auxiliary structure 5 comes into contact with the extraction electrode 3. In the example of FIG. 1, the auxiliary structure 5 is disposed to cover the extraction electrode 3. In this example, the auxiliary structure 5 consists of a single auxiliary component. Also, in this example, the auxiliary structure 5 comes into contact with the first part 3*a* and the second part 3*b* of the extraction electrode 3.

Also, in this example, the auxiliary structure 5 is disposed outside the extraction electrode 3. "Outside the extraction electrode 3" means, for example, a region or a position on the opposite side of the charged particle source 1 with respect to the extraction electrode 3 (that is, the charged particle source 1 is disposed inside the extraction electrode 3). In this manner, the charged particles do not collide with the auxiliary structure 5, and thus the factors that make the operation of the charged particle gun unstable can be reduced. Moreover, the heat generation of the auxiliary structure 5 can also be suppressed.

The electron gun 901 includes the charged particle source 1 that emits charged particles (electrons in this example). Although not shown in FIG. 1, the electron gun 901 has a mechanism for aligning the central axis of the charged particle source 1 and the central axis of the extraction electrode 3 in the direction of a voltage application unit shown in FIG. 1. The charged particle source 1 is held by a charged particle source holding member 7.

The extraction electrode 3 has a passing portion 3*c* that allows some of the charged particles to pass therethrough. The passing portion 3*c* is, for example, a circular opening. A part of the charged particle beam 2 emitted from the charged particle source 1 passes through the passing portion 3*c*, but the rest collides with the extraction electrode 3. That is, the extraction electrode 3 extracts the charged particles from the charged particle source 1, allows some of the charged particles to pass therethrough, and blocks some other charged particles.

Since a high voltage is applied to the extraction electrode 3, the collision of the charged particle beam 2 causes current to generate heat. In the conventional configuration, as the heat transfer path of the generated heat, there is only a heat conduction path 4 that propagates heat inside the extraction electrode 3, but in this example, a heat transfer path 6 that propagates heat inside the auxiliary structure 5 from the auxiliary structure 5 which is in contact with the outer surface of the extraction electrode 3 newly exists. Therefore, the conductance of heat transfer is increased, and the local temperature rise of the extraction electrode 3 is suppressed. Thus, the auxiliary structure 5 functions as a heat transfer structure.

Therefore, the thermal expansion of the extraction electrode 3 is suppressed, and the central axis of the extraction electrode 3 and the central axis of the charged particle source 1 continue to match each other without changing from the initially adjusted state. Accordingly, the charged particle source 1 can stably emit the charged particle beam 2.

The auxiliary structure 5 has an opening portion 5*c* through which some of the charged particles pass. The opening portion 5*c* is, for example, a circular opening. The opening portion 5*c* includes the entire passing portion 3*c* of the extraction electrode 3 when viewed from the optical axis direction. Such a configuration is realized when, for example, both the passing portion 3*c* and the opening portion 5*c* are formed in a circular shape, the diameter of the opening portion 5*c* is made larger than the diameter of the passing portion 3*c*, and the passing portion 3*c* and the opening portion 5*c* are arranged concentrically. In this manner, the charged particles do not collide with the auxiliary structure 5, and thus the factors that make the operation of the charged particle gun unstable can be reduced. Moreover, the heat generation of the auxiliary structure 5 can also be suppressed.

Figure 2B:
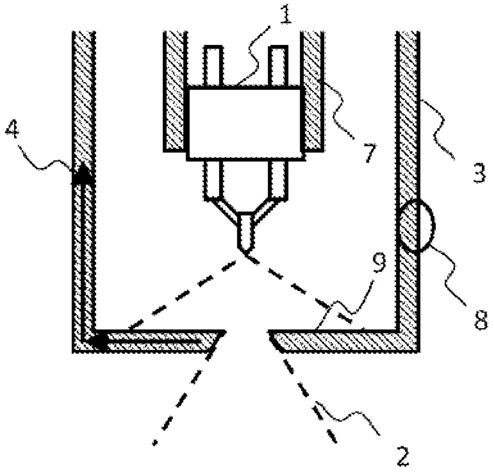

FIG. 2 is a comparative example which is an example of a heat generation situation in the charged particle gun having a conventional configuration. FIG. 2(*a*) shows the heat generation situation, and FIG. 2(*b*) shows a configuration example of the charged particle gun. Unlike FIG. 1, this charged particle gun is not provided with the auxiliary structure 5.

FIG. 2(*a*) shows a relationship between the electric power generated at the extraction electrode 3 and the temperature. In FIG. 2(*a*), the horizontal axis represents electric power and the vertical axis represents temperature. The electric power is obtained by the above expression (1). Calculation results and actual measurement results are plotted in FIG. 2(*a*). Solid and dashed lines represent the calculation result, and white circles represent the actual measurement result. The solid line is the temperature calculation result of a charged particle irradiation portion 9, and the dashed line is the temperature calculation result of a temperature measurement portion 8 at a position different from the charged particle irradiation portion 9. The actual measurement result of the temperature was measured at the position of the temperature measurement portion 8 in FIG. 2(*b*).

It can be seen from FIG. 2(*a*) that the temperature of the extraction electrode 3 increases monotonically as the electric power increases. Since the calculation result (dashed line) in the temperature measurement portion 8 and the experimental result (white circle) match each other, it is confirmed that the current generated by the charged particle beam 2 (that is, the electric power in the extraction electrode 3) generates heat, and it can be seen that the accuracy of the calculation results is high.

In FIG. 2(*b*), the location where the heat is generated the most is the charged particle irradiation portion 9, and in the calculation result in a case of 6.0 W, it can be seen that the temperature rises to 480° C. While the temperature of the charged particle irradiation portion 9 reaches 480° C., the temperature of the temperature measurement portion 8 remains at 280° C. Therefore, a temperature difference of 200° C. is generated within the extraction electrode in the operating environment of the charged particle gun. Due to this temperature difference, uneven thermal expansion occurs in the extraction electrode 3, and a non-rotationally symmetrical electric field is applied to the charged particle source 1. As a result, the amount of charged particles emitted from the charged particle source 1 becomes unstable.

Figure 3A:
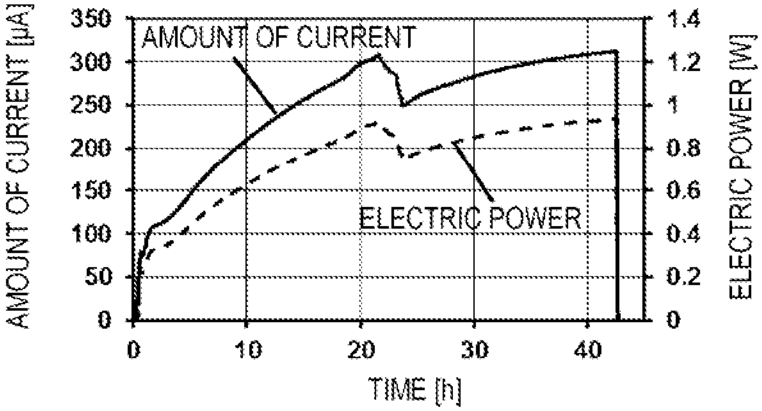
FIGS. 3A and 3B are a comparison result of change over time in an amount of charged particles emitted.
Figure 3B:
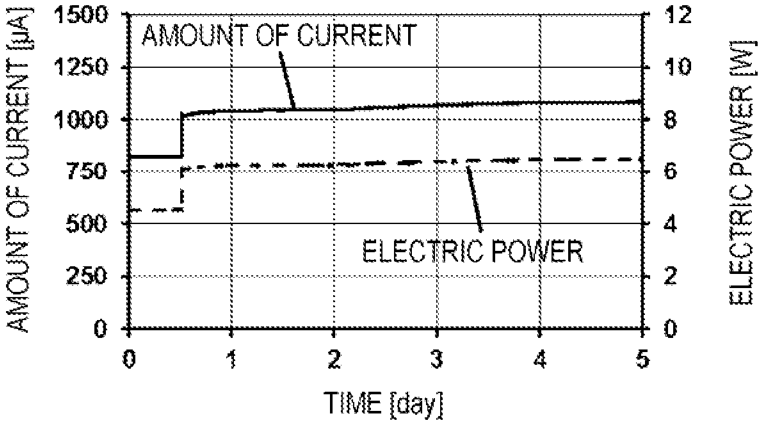

FIG. 3 shows a comparison result of change over time in the amount of charged particles emitted. FIG. 3(*a*) shows the result of a configuration without the auxiliary structure 5 (for example, the configuration shown in FIG. 2) as a comparative example, and FIG. 3(*b*) shows the result of a configuration with the auxiliary structure 5 (for example, the configuration according to Example 1).

A solid line represents the amount of current emitted from the electron source, and a dashed line represents the electric power obtained from expression (1). Electrons were emitted by applying a voltage to the electron source, and the change over time in the amount of current emitted from the electron source was measured.

In the case shown in FIG. 3(*a*) (without the auxiliary structure 5), when the electric power is increased, the amount of current decreases when the electric power becomes slightly less than 1 W, and it can be seen that the behavior is unstable. In FIG. 3(*a*), the amount of current is small. However, this is because the thermal expansion of the extraction electrode 3 caused the positional relationship between the charged particle source 1 and the extraction electrode 3 to change.

On the other hand, in the case shown in FIG. 3(*b*) (with the auxiliary structure 5), the electric power is increased to a high electric power of approximately 6.5 W after approximately 0.5 days have passed. However, even when this high electric power is maintained, it can be seen that the current is stable for a long period of time. With such a high electric power, in the configuration without the auxiliary structure 5, a temperature difference of 200° C. or higher occurs in the extraction electrode 3, and the current becomes unstable. However, in the configuration with the auxiliary structure 5, it can be seen that it is possible to provide stable charged particle emission.

Although FIG. 3(*b*) only shows data up to the fifth day, the inventors have confirmed that the electric power does not fluctuate even after continuous operation for one year or longer. From these results, it can be seen that the electron gun 901 according to Example 1 contributes to long-term stable operation of a charged particle beam system in a device under high-throughput observation conditions requiring a large amount of charged particles.

Therefore, with the electron gun 901 and the length-measuring SEM 900 of this example, uneven temperature distribution in the extraction electrode is suppressed. In particular, in the example of FIG. 1, since the auxiliary structure 5 comes into contact with both the first part 3*a* and the second part 3*b* of the extraction electrode 3, heat conduction from the second part 3*b* in the vicinity of the tip end to the first part 3*a* on the root side is promoted, and the temperature distribution becomes more uniform. In this manner, it is possible to achieve both high throughput of the device by increasing the amount of charged particles emitted and long-term stable operation based on stable charged particle emission.

Example 2

In Example 2, the configuration around the extraction electrode 3 in Example 1 is partially changed. Differences from Example 1 will be described below.

FIG. 4 shows a configuration example of an electron gun according to Example 2. The electron gun includes the conductive member 20 for applying voltage to the extraction electrode 3. The conductive member 20 is, for example, a member which is called a voltage introduction electrode. The extraction electrode 3 is fixed to the conductive member 20 with screws 21. Heat generated by the extraction electrode 3 is conducted to the conductive member 20 through the screw 21 as indicated by a heat transfer path 22 through the screw 21.

However, the contact area between the screw 21 and the conductive member 20 is small and the thermal conductivity is low. Therefore, by bringing the auxiliary structure 5 into contact with the extraction electrode 3 and the conductive member 20 to increase the contact area, the thermal conductivity is greatly improved, and the temperature rise of the extraction electrode 3 can be suppressed more efficiently. By suppressing the temperature rise of the extraction electrode 3, thermal expansion is suppressed, and stable electron emission from the charged particle source 1 can be obtained.

Here, the screw 21 is a fixing member that fixes the extraction electrode 3 and the conductive member 20 to each other, but it can also be configured to function as an adjustment mechanism that adjusts the positional relationship between the extraction electrode 3 and the conductive member 20. For example, as shown in FIG. 4, in a state where the extraction electrode 3 and the conductive member 20 are in contact with each other, and a central axis A3 of the extraction electrode 3, a central axis A20 of the conductive member 20, and a central axis A1 of the charged particle source 1 match each other, the screw 21 adjusts the positional relationship between the extraction electrode 3 and the conductive member 20 and fixes the extraction electrode 3 and the conductive member 20. By doing so, the positional relationship between the extraction electrode 3 and the conductive member 20 can be easily adjusted.

The auxiliary structure 5 is arranged to cover the extraction electrode 3. Therefore, the relative positions of the charged particle source 1 and the extraction electrode 3 can be adjusted first, and then the auxiliary structure 5 can be attached. Therefore, the attachment of the auxiliary structure 5 does not affect the alignment between the central axis of the charged particle source 1 and the central axis of the extraction electrode 3.

The orientation of the screw 21 can be changed in any manner, and the extraction electrode 3 can be fixed to the conductive member 20 from any direction. In FIG. 4, the screw 21 is inserted in the radial direction of the optical axis from the outside toward the inside, but the screw 21 can also be inserted into the extraction electrode 3 in the optical axis direction, for example, in the direction facing the charged particle source 1 from the side opposite to the charged particle source 1.

Example 3

In Example 3, the configuration of the auxiliary structure 5 in Example 1 is changed such that the auxiliary structure 5 is configured by a plurality of components. Differences from Example 1 will be described below.

Figure 5A:
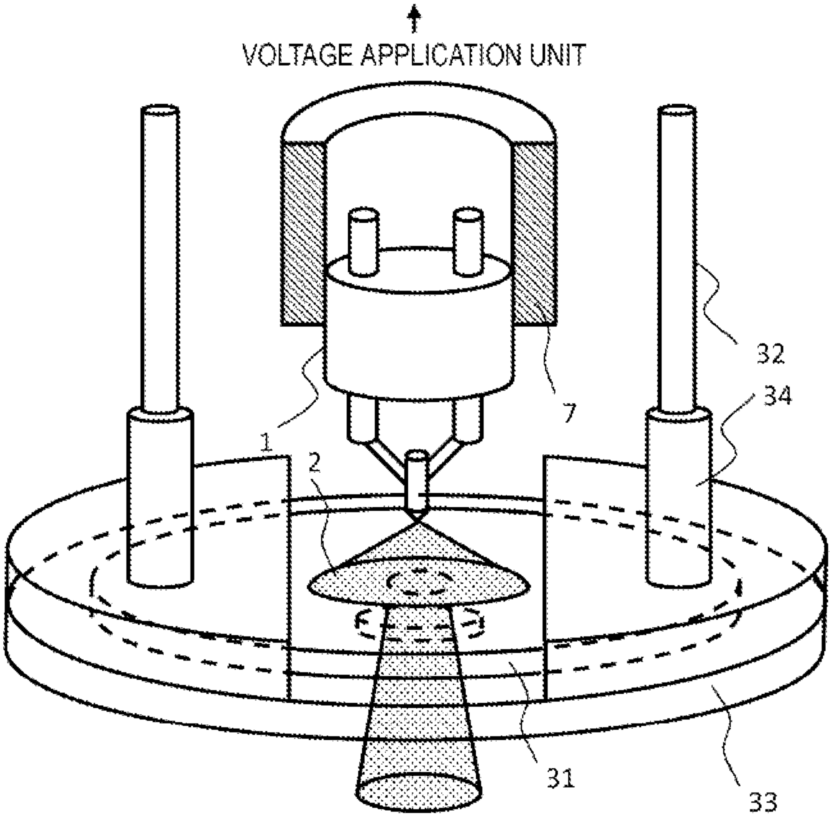
FIGS. 5A and 5B are a configuration example of an electron gun according to Example 3.
Figure 5B:
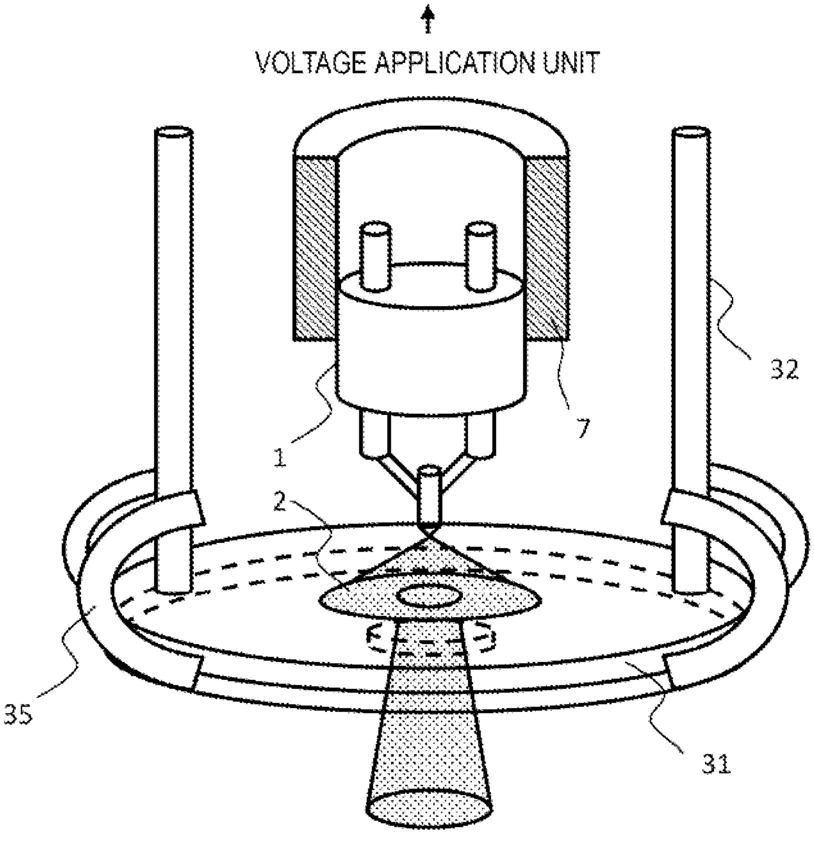

FIG. 5 shows two configuration examples of the electron gun according to Example 3. Both electron guns in FIGS. 5(*a*) and 5(*b*) are provided with a plate-like extraction electrode 31 as an extraction electrode. Although not shown in the drawing, in both of the configurations of FIGS. 5(*a*) and 5(*b*), a mechanism for aligning the central axis of the charged particle source 1 with the central axis of the plate-like extraction electrode 31 is provided in the direction of the voltage application unit. A voltage is applied to the plate-like extraction electrode 31 by the conductive member 32 (functioning as a voltage introduction terminal), and electrons are emitted from the charged particle source 1.

In the example of FIG. 5(*a*), the auxiliary structure is divided into a plurality of components and includes a first auxiliary component 33 and a second auxiliary component 34. The first auxiliary component 33 and the second auxiliary component 34 are fixed in contact with each other. The first auxiliary component 33 comes into contact with the plate-like extraction electrode 31 and the second auxiliary component 34 comes into contact with the conductive member 32. These auxiliary components efficiently conduct the heat generated by the plate-like extraction electrode 31 to the conductive member 32. The first auxiliary component 33 and the second auxiliary component 34 can be fixed by screws, welding or the like, for example.

Here, in the example shown in FIG. 5(*a*), the shapes of the plate-like extraction electrode 31 and the conductive member 32 are significantly different, and it is difficult to form a shape that can efficiently cover these surfaces with a single auxiliary component. However, by dividing the auxiliary structure into the first auxiliary component 33 and the second auxiliary component 34 as in this example, the manufacturing becomes easier.

In FIG. 5(*a*), by forming the conductive member 32 and the auxiliary component (that is, the second auxiliary component 34) in contact therewith from the same material, the heat transfer coefficient can be improved more efficiently.

In the example of FIG. 5(*b*), the auxiliary structure includes a plurality of heat conducting terminals 35. The heat conducting terminals 35 are in contact with both the plate-like extraction electrode 31 and the conductive member 32, and conduct heat generated in the plate-like extraction electrode 31 to the conductive member 32. The heat conducting terminals 35 are made of metal, for example, and are configured, for example, as wires or plates. The wire or plate is fixed to the plate-like extraction electrode 31 and the conductive member 32 by welding, screws, or the like.

In addition, in FIGS. 5(*a*) and 5(*b*), the conductive member 32 has a rod-like shape, but the shape and number of the conductive members 32 are not limited to those shown in the drawings. For example, the conductive member 32 may have a columnar shape or a square shape, and the number may be any number as long as the number is one or more.

Further, there is no restriction on the number of auxiliary components that configure the auxiliary structure. Moreover, it is not necessary to use the same material for each auxiliary component.

Example 4

Example 4 limits the material of the auxiliary structure 5 in Example 1. Differences from Example 1 will be described below.

In Example 4, the auxiliary structure 5 contains a material having a thermal conductivity of 10 W/mK or higher as shown in FIG. 1, for example, the entire auxiliary structure 5 is made of such material. As a material for the extraction electrode 3, SUS or titanium is generally widely used. For this reason, it is desirable that the auxiliary structure 5 includes a material having such a high thermal conductivity. In particular, materials with high thermal conductivity such as copper, silver, aluminum, and gold are effective.

Example 4 can be similarly applied to the auxiliary structure 5 in Example 2 and the first auxiliary component 33 and the second auxiliary component 34 in Example 3.

Example 5

In Example 5, the auxiliary structure 5 in Example 1 is provided with fins. Differences from Example 1 will be described below.

FIG. 6 shows a configuration example of an electron gun according to Example 5. In this example, the surface area of the auxiliary structure is increased to improve the heat radiation efficiency. More specifically, the auxiliary structure 41 includes a heat radiation fins 41*a*. The heat radiation fins 41*a* improve the efficiency of heat radiation. As for the shape of the heat radiation fins 41*a*, a disk shape is desirable in consideration of workability, but it is not necessary to have a disk shape. It may have a polygonal shape or a projection shape.

It is suitable to set the surface area of the heat radiation fins 41*a* to 420 $mm^2$ or more. In the example of FIG. 6, there is one heat radiation fin 41*a*, but two or more fins may be provided. The auxiliary structure may be configured such that the fins are separate components and the fins can be removed from the main body of the auxiliary structure.

In this example, the auxiliary structure 41 has the heat radiation fins 41*a*, but instead of or in addition to this, the extraction electrode 3 may have heat radiation fins. Moreover, when the electron gun includes a conductive member (for example, the conductive member 20 in FIG. 4), the conductive member may include heat radiation fins.

Example 6

In Example 6, a specific structure is provided on the surface of the auxiliary structure 5 in Example 1. Differences from Example 1 will be described below.

FIGS. 7(*a*) to 7(*c*) show configuration examples of the electron gun according to Example 6. As shown in FIG. 7(*b*), in the auxiliary structure 5, a heat transfer layer 51 containing a material having a thermal conductivity of 10 W/mK or higher is formed on at least a part of the surface in contact with the extraction electrode 3 and the conductive member 20.

Moreover, as shown in FIG. 7(*c*), the screw 21 is provided with the heat transfer layer 51. The heat transfer layer 51 is provided, for example, on the surface of the screw 21, and as a more specific example, is provided on the entire radial outer surface of the screw head. Thus, in this example, the screw 21 has a heat transfer structure. The screw 21 is disposed such that the heat transfer layer 51 comes into contact with both the extraction electrode 3 and the conductive member 20.

Thus, by providing the heat transfer layer 51 with particularly high thermal conductivity on the surface of the auxiliary structure 5 and also providing the heat transfer layer 51 on the surface of the screw 21, the efficiency of heat transfer can be further improved, and the heat generation of the extraction electrode can be conducted with higher efficiency.

The heat transfer layer 51 can be made of metal, for example. The heat transfer layer 51 desirably contains a material having a thermal conductivity of 10 W/mK or higher. Examples of such materials include metals with high thermal conductivity such as indium, silver, molybdenum, hafnium, aluminum, nickel, tungsten, gold, copper, and the like. The film forming method and thickness of the heat transfer layer 51 shown in Example 6 are not limited. Examples of film forming methods include sputtering, vacuum deposition, and plating.

In particular, it is suitable that the heat transfer layer 51 is made of a material having a higher thermal conductivity than the other parts (that is, the parts of the auxiliary structure 5 other than the heat transfer layer 51 and the parts of the screw 21 other than the heat transfer layer 51). Copper is suitable as such a material.

The heat transfer layer 51 of the auxiliary structure 5 is suitably formed over the entire surface that comes into contact with the extraction electrode 3 and the conductive member 20, but may be formed over at least part of such a surface. Similarly, the heat transfer layer 51 of the screw 21 is suitably formed over the entire surface that comes into contact with the extraction electrode 3 and the conductive member 20, but may be formed over at least part of such a surface.

As a modification example of Example 6, the heat transfer layer 51 of the auxiliary structure 5 may be formed only on the surface that comes into contact with either the extraction electrode 3 or the conductive member 20. Also, either the heat transfer layer 51 of the auxiliary structure 5 or the heat transfer layer 51 of the screw 21 may be omitted.

The heat transfer layer 51 used in Example 6 can also be used when dividing the auxiliary structure into a plurality of components. In such a case, the heat transfer layer 51 may be provided on the contact surfaces of the auxiliary components. In this manner, the efficiency of heat transfer between the auxiliary components is improved. In such a configuration, the material of the heat transfer layer 51 of each auxiliary component need not be the same.

Example 7

In Example 7, a specific structure is provided on the surface of the auxiliary structure 5 in Example 1. Differences from Example 1 will be described below.

FIGS. 7(*a*) and 7(*d*) show a configuration example of the electron gun according to Example 7. A metal layer 52 is provided on the outer surface of the auxiliary structure 5 (particularly, the surface not in contact with the extraction electrode 3). The metal layer 52 is made of a material different from that of the parts other than the metal layer 52 in the auxiliary structure 5.

As a specific example, the metal layer 52 may contain a metal having an emissivity of 0.1 or higher. In this manner, in addition to the heat transfer inside the auxiliary structure 5, the heat of the extraction electrode 3 can be dissipated by heat radiation from the metal layer 52, and the temperature rise of the extraction electrode 3 can be further suppressed. As the material of the metal layer 52, a metal having a high emissivity is suitable, such as nickel, stainless steel, chromium, and brass.

In Example 7, the auxiliary structure 5 may be divided into a plurality of auxiliary components. In that case, the material of the metal layer 52 need not be the same for all auxiliary components.

Example 7 can also be implemented in combination with Example 6. In that case, the material of the heat transfer layer 51 and the metal layer 52 need not be the same.

By combining Example 7 and Example 5, the efficiency of heat radiation can be further improved.

The metal layer 52 is suitably formed over the entire outer surface of the auxiliary structure 5 (particularly, the entire surface not in contact with the extraction electrode 3), but may be formed over at least a part of the outer surface.

Example 8

In Example 8, the material of the main body of the auxiliary structure in Example 6 or 7 is limited. Differences from Examples 6 and 7 will be described below.

As shown in FIG. 7 (Examples 6 and 7), when the heat transfer layer 51 or the metal layer 52 are provided on the surface of the auxiliary structure (the auxiliary structure 5 or the screw 21), as the materials of the other parts of the auxiliary structure, a material having a low specific heat and low density (that is, a material having a low heat capacity) is suitable. For example, the auxiliary structure suitably contains a material having a specific heat of 0.6 J/kgK or less and a specific gravity of 5 g/cm$^3$ or less. The entire auxiliary structure may be made of such a material.

A representative material is titanium. Since titanium has a small heat capacity, the temperature rises quickly, but because of its low thermal conductivity, it is difficult to heat a place far from the heat source. Therefore, by forming the heat transfer layer 51 or the metal layer 52 that conducts heat on the surface of a material having a small heat capacity, such as titanium, heat can be uniformly transferred to the entire auxiliary structure. As a result, the temperature of the entire auxiliary structure rises in a short period of time, and thus the heat transfer performance of the heat transfer structure is improved.

Example 9

In Example 9, the auxiliary structure 5 in Example 1 is subjected to surface treatment. Differences from Example 1 will be described below.

As shown in FIG. 1, in Example 9, the auxiliary structure 5 is subjected to surface treatment in order to increase the emissivity. Surface treatment is treatment for reducing surface roughness, such as mirror finishing. In particular, when mirror finishing is performed, the heat radiation increases due to the increase in the emissivity. When the surface of the electrode is rough, there is a possibility that discharge of the charged particle gun occurs, but this can be suppressed by surface treatment, resulting in more stable operation.

Example 10

In Example 10, a charged particle amount adjustment electrode is additionally provided to the configuration of Example 1. Differences from Example 1 will be described below.

FIG. 8 shows a configuration example of an electron gun according to Example 10. The electron gun has a charged particle amount adjustment electrode 61 (adjustment electrode). The charged particle amount adjustment electrode 61 has a function of adjusting the electric field strength at the tip end of the charged particle source 1 or a function of adjusting the amount of charged particles emitted from the charged particle source 1. For example, the charged particle amount adjustment electrode 61 adjusts the electric field strength around the tip end of the charged particle source 1 to make it possible to adjust the amount of charged particles emitted from the charged particle source 1. The charged particle amount adjustment electrode 61 may be called a suppressor, for example.

Although not particularly shown in FIG. 8, the electron gun has a mechanism for adjusting the positions of the charged particle source 1 and the extraction electrode 3 in the direction of the voltage application unit. In addition, the electron gun also has a mechanism for adjusting the position of the charged particle amount adjustment electrode 61. Such a configuration can be combined with any of Examples 1 to 9.

According to Example 10, the intensity of the charged particle beam can be adjusted more appropriately.

In the above description of Examples 1 to 10, specific combinations of Examples have been described, but each Example can be implemented in any combination.

REFERENCE SIGNS LIST

1: charged particle source
2: charged particle beam
3: extraction electrode
3*a*: first part
3*b*: second part
3*c*: passing portion
4: heat conduction path
5: auxiliary structure (heat transfer structure)
5*c*: opening portion
6: heat transfer path
8: temperature measurement portion
9: charged particle irradiation portion
20: conductive member
21: screw (heat transfer structure)
22: heat transfer path
31: plate-like extraction electrode (extraction electrode)
32: conductive member
33: first auxiliary component (heat transfer structure)
34: second auxiliary component (heat transfer structure)
35: heat conducting terminal (heat transfer structure)
51: heat transfer layer
52: metal layer
41: auxiliary structure (heat transfer structure)
41*a*: heat radiation fin
61: charged particle amount adjustment electrode (adjustment electrode)
900: length-measuring SEM (charged particle beam system)
901: electron gun (charged particle gun)
920: computer system
A, A1, A3, A20: central axis

The invention claimed is:

1. A charged particle gun comprising:
a charged particle source;
an extraction electrode that extracts charged particles from the charged particle source, allows some of the charged particles to pass therethrough, and blocks some other charged particles; and
a continuous heat transfer structure that is different from the extraction electrode and comes into contact with two or more surfaces including at least a perpendicular surface of the extraction electrode with respect to a traveling direction of the charged particles extracted from the charged particle source, facing the traveling direction and a surface of the extraction electrode parallel to the traveling direction, at an area or at a position opposed to the charged particle source with respect to the extraction electrode.

2. The charged particle gun according to claim 1, wherein
the extraction electrode has a passing portion that allows some of the charged particles to pass therethrough,
the heat transfer structure comes into contact with a surface opposite to the charged particle source in the extraction electrode, and
the heat transfer structure has an opening portion that includes the entire passing portion when viewed from an optical axis direction of the charged particle source.

3. The charged particle gun according to claim 1, wherein
the extraction electrode or the heat transfer structure includes a heat radiation fin on outer periphery thereof.

4. The charged particle gun according to claim 1, wherein
in the heat transfer structure, a contact surface with the extraction electrode contains indium, silver, molybdenum, hafnium, aluminum, nickel, tungsten, gold, or copper.

5. The charged particle gun according to claim 1, further comprising:
a conductive member for applying a voltage to the extraction electrode; and
a fixing member that fixes the extraction electrode and the conductive member to each other, wherein
the fixing member includes the heat transfer structure, and
the heat transfer structure is in contact with the extraction electrode and contains a metal having a thermal conductivity of 10 W/mK or higher.

6. The charged particle gun according to claim 1, further comprising:
an adjustment electrode, wherein
the adjustment electrode is capable of adjusting an amount of the charged particles emitted from the charged particle source by adjusting an electric field strength around a tip end of the charged particle source.

7. The charged particle gun according to claim 1, wherein the charged particle gun further includes a conductive member for applying a voltage to the extraction electrode, and the heat transfer structure further comes into contact with the conductive member on a surface parallel to an optical axis direction of the charged particle source.

8. The charged particle gun according to claim 1, wherein the heat transfer structure is a heat transfer structure body formed by combining a plurality of components.

9. A charged particle gun according to claim 1, wherein the heat transfer structure is subjected to surface treatment.

10. A charged particle beam system comprising:

the charged particle gun according to claim 1; and a computer system that controls the charged particle gun.

11. A charged particle gun comprising:

a charged particle source;

an extraction electrode that extracts charged particles from the charged particle source, allows some of the charged particles to pass therethrough, and blocks some other charged particles;

a continuous heat transfer structure that is different from the extraction electrode and comes into contact with two or more surfaces including at least a perpendicular surface with respect to a traveling direction of the charged particles extracted from the charged particle source, facing the traveling direction and a surface parallel to the traveling direction, outside the extraction electrode;

a conductive member for applying a voltage to the extraction electrode; and an adjustment mechanism that adjusts a positional relationship between the extraction electrode and the conductive member, wherein the adjustment mechanism adjusts a positional relationship between the extraction electrode and the conductive member and fixes the extraction electrode and the conductive member in a state where the extraction electrode and the conductive member are in contact with each other, and a central axis of the extraction electrode, a central axis of the conductive member, and a central axis of the charged particle source match each other.

12. A charged particle gun comprising:

a charged particle source;

an extraction electrode that extracts charged particles from the charged particle source, allows some of the charged particles to pass therethrough, and blocks some other charged particles; and a continuous heat transfer structure that is different from the extraction electrode and comes into contact with two or more surfaces including at least a perpendicular surface with respect to a traveling direction of the charged particles extracted from the charged particle source, facing the traveling direction and a surface parallel to the traveling direction, outside the extraction electrode;

wherein the heat transfer structure uses gold, silver, copper, or aluminum as a base material.

13. A charged particle gun comprising:

a charged particle source;

an extraction electrode that extracts charged particles from the charged particle source, allows some of the charged particles to pass therethrough, and blocks some other charged particles; and a continuous heat transfer structure that is different from the extraction electrode and comes into contact with two or more surfaces including at least a perpendicular surface with respect to a traveling direction of the charged particles extracted from the charged particle source, facing the traveling direction and a surface parallel to the traveling direction, outside the extraction electrode;

wherein in the heat transfer structure, at least a part of a surface which is not in contact with the extraction electrode contains a metal having an emissivity of 0.1 or higher.

14. A charged particle gun comprising:

a charged particle source;

an extraction electrode that extracts charged particles from the charged particle source, allows some of the charged particles to pass therethrough, and blocks some other charged particles; and a continuous heat transfer structure that is different from the extraction electrode and comes into contact with two or more surfaces including at least a perpendicular surface with respect to a traveling direction of the charged particles extracted from the charged particle source, facing the traveling direction and a surface parallel to the traveling direction, outside the extraction electrode;

wherein the heat transfer structure uses a material having a specific heat of 0.6 J/kgK or less and a specific gravity of 5 $g/cm^3$ or less as a base material, and wherein the heat transfer structure is covered with a material having a thermal conductivity of 10 W/mK or higher.

* * * * *